US012751242B2

(12) United States Patent
Zhou et al.

(10) Patent No.: US 12,751,242 B2
(45) Date of Patent: Sep. 29, 2026

(54) COVER FOR A WAFER

(71) Applicant: Viavi Solutions Suzhou Co., Ltd., Suzhou (CN)

(72) Inventors: Liang Zhou, Suzhou City (CN); Ling Liu, Suzhou City (CN)

(73) Assignee: VIAVI Solutions Suzhou Co., Ltd., Suzhou (CN)

( * ) Notice: Subject to any disclaimer, the term of this patent is extended or adjusted under 35 U.S.C. 154(b) by 0 days.

(21) Appl. No.: 18/608,524

(22) Filed: Mar. 18, 2024

(65) Prior Publication Data

US 2024/0347358 A1 Oct. 17, 2024

(30) Foreign Application Priority Data

Apr. 17, 2023 (WO) ................ PCT/CN2023/088777

(51) Int. Cl.
*H10P 72/10* (2026.01)

(52) U.S. Cl.
CPC ................................ *H10P 72/1902* (2026.01)

(58) Field of Classification Search
CPC ......... H01L 21/67353; H01L 21/67356; H01L 21/6735; H01L 21/67359; H01L 21/67376; H10P 72/1902; H10P 72/19; H10P 72/1906; H10P 72/1904; H10P 72/1921; H10P 72/1922
USPC .................................................. 206/710, 454
See application file for complete search history.

(56) References Cited

U.S. PATENT DOCUMENTS 5,314,068 A * 5/1994 Nakazato ............... B65D 55/12 206/454
5,553,711 A * 9/1996 Lin ................... H01L 21/67386 206/454
5,823,351 A * 10/1998 Matsuo ................ B65D 11/188 206/454
6,119,865 A * 9/2000 Kawada ............ H01L 21/67386 206/454
6,216,873 B1 * 4/2001 Fosnight ................... G03F 1/66 206/454
6,533,123 B1 * 3/2003 Nakamura ........ H01L 21/67396 206/454
7,854,327 B2 * 12/2010 Hyobu ............. H01L 21/67294 206/509
2006/0283772 A1 * 12/2006 Nishizaka ......... H01L 21/67353 206/723
2007/0284282 A1 * 12/2007 Yajima .............. H01L 21/67346 206/503

(Continued)

FOREIGN PATENT DOCUMENTS

CN 1787198 A 6/2006

OTHER PUBLICATIONS

International Search Report for International Application No. PCT/CN2023/088777 mailed Dec. 28, 2023.

*Primary Examiner* — Steven A. Reynolds
(74) *Attorney, Agent, or Firm* — Harrity & Harrity, LLP

(57) ABSTRACT

In some implementations, a cover for a wafer that is on a wafer frame includes a top portion configured to span an entirety of a top surface of the wafer; and a side portion configured to span an entirety of a side surface of the wafer, wherein the side portion extends at a non-zero angle from the top portion to allow the cover to enclose the wafer on the wafer frame. In some implementations, a carrier for a wafer includes the wafer, the wafer frame, and the cover.

20 Claims, 4 Drawing Sheets

(56) References Cited

U.S. PATENT DOCUMENTS

| | | | | |
|---|---|---|---|---|
| 2008/0041760 | A1* | 2/2008 | Durben | H01L 21/67359<br>414/217.1 |
| 2011/0049006 | A1* | 3/2011 | Pylant | H01L 21/67373<br>206/710 |
| 2012/0037522 | A1* | 2/2012 | Chiu | H01L 21/67359<br>206/316.1 |
| 2015/0266660 | A1* | 9/2015 | Lystad | B65D 25/10<br>206/454 |

* cited by examiner

COVER FOR A WAFER

CROSS-REFERENCE TO RELATED APPLICATION

This patent application claims priority to Patent Cooperation Treaty (PCT) Patent Application No. PCT/CN2023/088777, filed on Apr. 17, 2023, and entitled "COVER FOR A WAFER." The disclosure of the prior application is considered part of and is incorporated by reference into this patent application.

BACKGROUND

A wafer comprises a material (e.g., a semiconductor material, such as silicon) on which components (e.g., optical components, electrical components, opto-electrical components, or other components), commonly referred to as dies, are formed.

SUMMARY

In some implementations, a cover for a wafer that is on a wafer frame includes a top portion configured to span an entirety of a top surface of the wafer; and a side portion configured to span an entirety of a side surface of the wafer, wherein the side portion extends at a non-zero angle from the top portion to allow the cover to enclose the wafer on the wafer frame.

In some implementations, a carrier for a wafer includes the wafer; a wafer frame; and a cover, wherein: the wafer is disposed on the wafer frame, a top portion of the cover spans an entirety of a top surface of the wafer, a side portion of the cover spans an entirety of a side surface of the wafer, and the cover encloses the wafer on the wafer frame.

In some implementations, a carrier for a wafer includes a cover, wherein: a top portion of the cover spans an entirety of a top surface of the wafer; a side portion of the cover spans an entirety of a side surface of the wafer; and the side portion extends from the top portion to allow the cover to enclose the wafer on a wafer frame of the carrier.

DETAILED DESCRIPTION

Figure 1A:
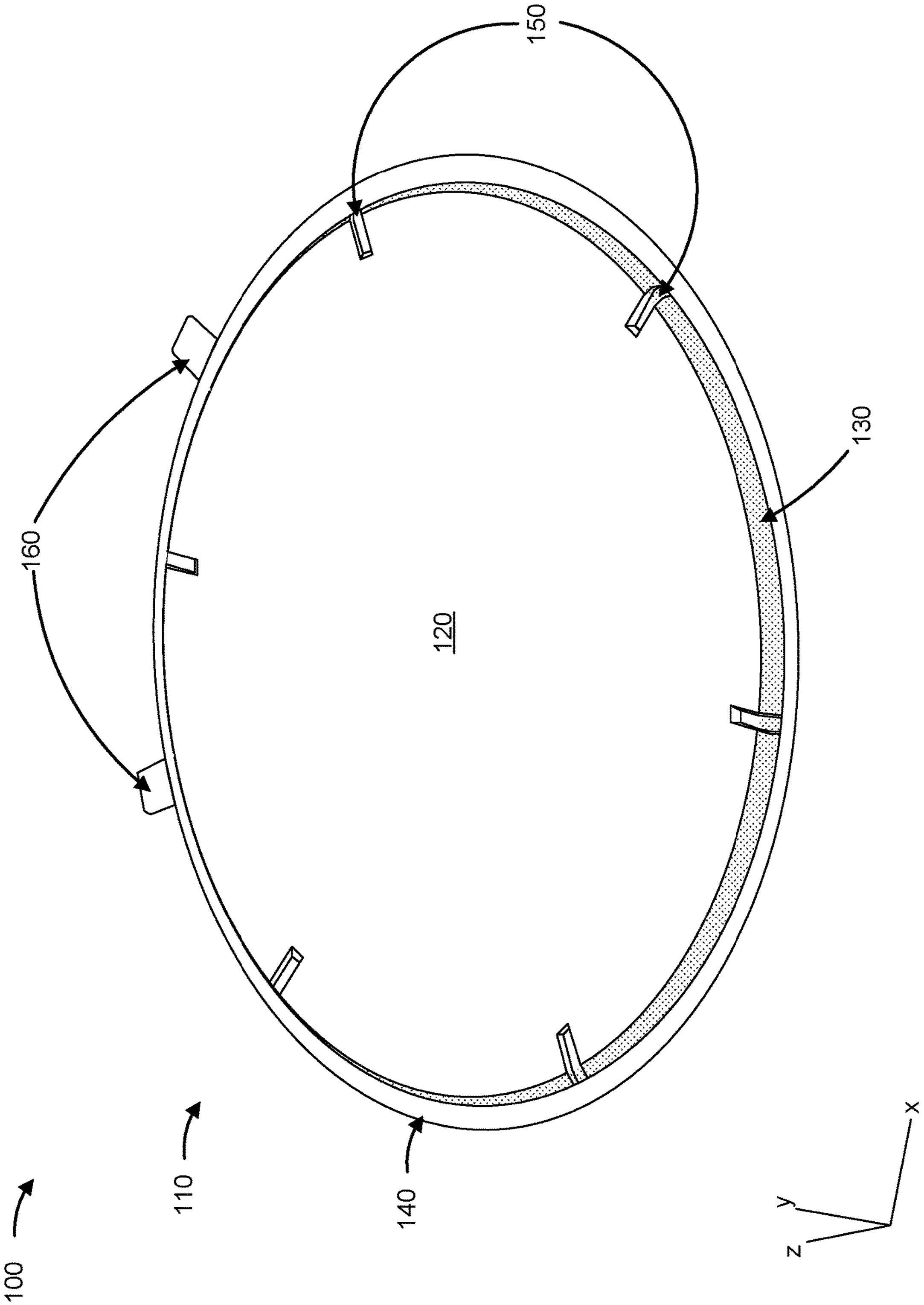
FIGS. 1A-1B are diagrams of an example implementation described herein.

The following detailed description of example implementations refers to the accompanying drawings. The same reference numbers in different drawings may identify the same or similar elements.

Dies formed on a wafer are typically very delicate and can be easily damaged by environmental factors such as moisture, dust, and electrostatic discharge (ESD). In many cases, protective tape is applied to a top surface of the dies to protect the dies from such environmental factors. The protective tape includes an adhesive on one side and is applied to a top surface of the wafer, covering the dies, and is trimmed to the edge of the wafer. The protective tape, because of the adhesive, is secured to the surface of the wafer, and thus provides a barrier between the dies and the environment. At a subsequent time, such as after the wafer has been transported to a location where the dies are to be removed from the wafer (e.g., for use in a device), the protective tape can be removed (e.g., by pulling the protective tape off) to expose the dies (e.g., for removal from the wafer).

However, in some cases, a residue (e.g., from the adhesive of the protective tape) is left on a surface of the wafer after removal of the protective tape. This can be because of an improper removal technique, but also can be because of degradation of the protective tape due to environmental factors. For example, when the protective tape is subject to high humidity, high temperature, or cycles of high humidity and/or high temperature, molecules of the adhesive break down to form molecules that can adhere to a surface of the wafer. This creates the residue that is left on the dies and therefore impairs a performance (e.g., an optical performance, an electrical performance, and/or an opto-electrical performance) of the dies. A reworking process (e.g., a cleaning process, an etching process, and/or a polishing process) can be used to remove the residue from the dies, but this is a time-and-resource-intensive process that thereby also increases cost and complexity. Additionally, the reworking process increases a likelihood of damaging one or more of the dies, which reduces a yield of operable dies that can be removed from the wafer.

Further, while the protective tape offers some physical protection to the dies of the wafer, the protective tape is primarily designed to protect the dies from environmental damage. The protective tape offers little protection from vibrations and shocks to the wafer (and therefore to the dies), such as vibrations and shocks that result from transportation of the wafer (e.g., in a wafer carrier). Consequently, the protective tape does little to reduce a likelihood of physical damage to the dies of the wafer.

Some implementations described herein provide a cover (e.g., that includes a material that comprises at least a plastic, such as a material that comprises at least polyethylene terephthalate (PET)) for a wafer (e.g., when the wafer is disposed on a wafer frame, such as in a wafer carrier). The cover includes a top portion that spans a top surface of the wafer (e.g., that includes one or more dies, such as one or more optical filters) and a side portion of the cover spans a side surface (e.g., a side perimeter surface) of the wafer, such as when the cover is placed over the wafer on the wafer frame. In this way, the cover encloses the wafer (e.g., on the wafer frame).

Accordingly, the cover provides an internal environment (e.g., formed by the cover and the wafer frame) that protects the wafer, and the dies of the wafer, from environmental factors such as moisture, dust, and ESD. Further, because the cover does not require an adhesive to place the cover over the wafer, no residue is ever left behind on the wafer, or on the dies of the wafer, after removal of the cover from over the wafer. Therefore, a performance (e.g., an optical performance, an electrical performance, and/or an opto-electrical performance) of the dies is not impacted by a residue, and a reworking process does not need to be performed. This conserves time and resources (e.g., resources that would otherwise be used to perform a reworking process), which can reduce a cost and complexity associated with removing the dies from the wafer. Further, because a reworking process does not need to be performed, the dies are less likely to be damaged (e.g., in association with removal of the cover), and therefore a yield of operable dies that can be removed from the wafer is increased (as compared to a yield associated with a wafer that has residue from a protective tape).

In some implementations, the top portion of the cover and the side portion of the cover are configured such that they do not contact the top surface and the side surface of the wafer, respectively (e.g., by providing gaps between the portions and the surfaces). Further, the top portion of the cover may include one or more structural components (e.g., indentations, ribs, and/or the like) that are configured to reduce (or to prevent) bending of the top portion of the cover (e.g., when a force is applied to the top portion of the cover). In this way, the cover provides physical protection to the dies of the wafer. For example, the top portion and the side portion of the cover provide clearances such that the top surface and the side surface of the wafer do not contact the respective portions of the cover when the wafer is subject to vibrations and shocks (e.g., during transportation of the wafer in a carrier). Additionally, because the cover includes a material that comprises at least a plastic (e.g., provides strength and durability), and includes one or more structural components, the cover can withstand forces (e.g., crushing forces) that can damage the dies of the wafer (and that would otherwise not be resisted by protective tape). The cover therefore reduces a likelihood of physical damage to the dies of the wafer (as compared to using a protective tape).

Additionally, the cover described herein can be used with any type of wafer and any types of dies. As compared to a protective tape, which may need to be specifically designed for use with particular wafers and particular dies, the cover provides flexibility for different uses. This can help reduce inventory complexity (e.g., by not having to order, manage, and store different types of protective tape), and because the cover is made from material (e.g., that includes plastic) that is more easily obtainable and configurable (as opposed to a specialized multi-layer protective tape with a particular adhesive), costs and lead times associated with obtaining and/or manufacturing the cover are reduced.

Figure 1B:
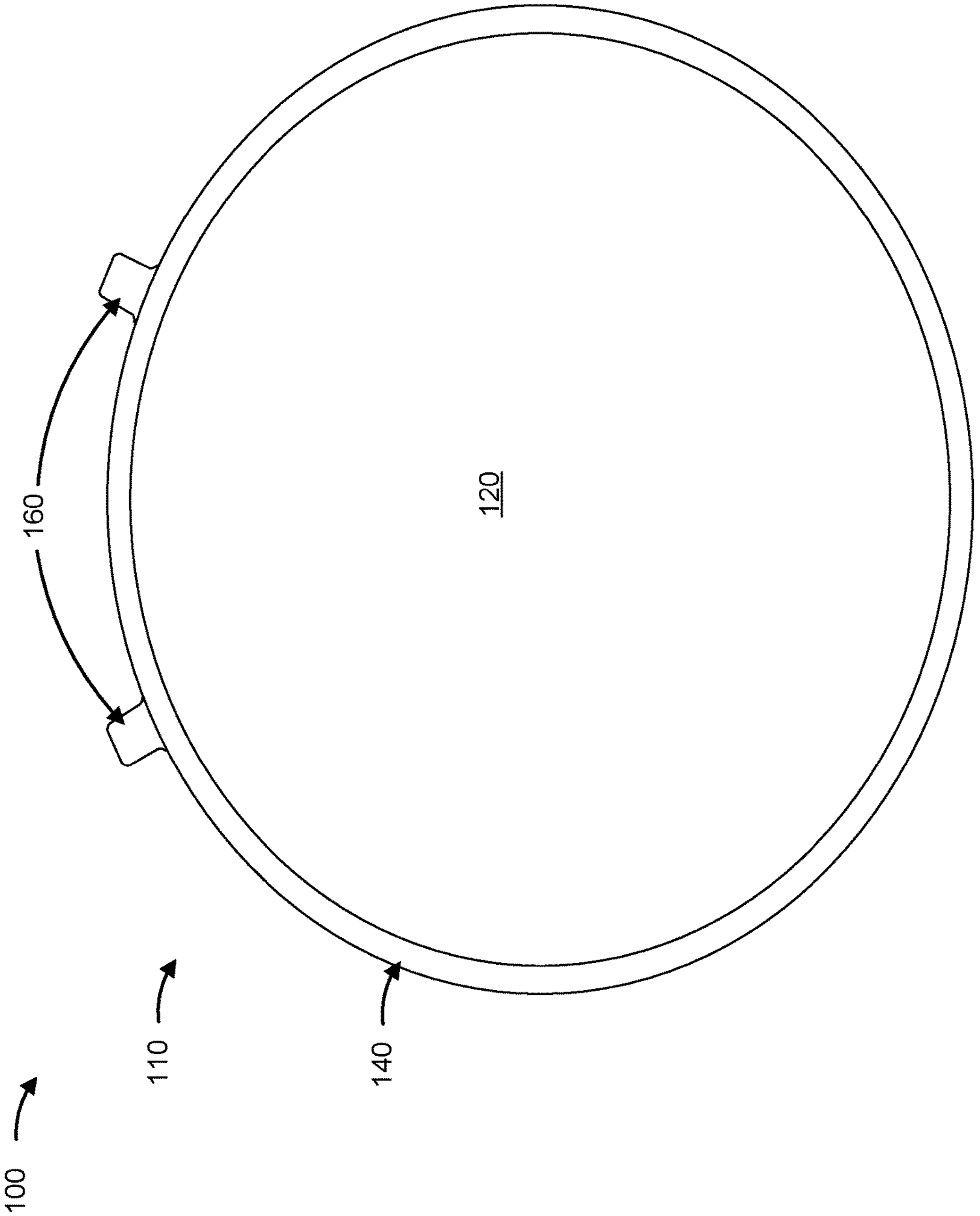

FIGS. 1A-1B are diagrams of an example implementation 100 described herein. As shown in FIGS. 1A-1B, example implementation 100 includes a cover 110, which may include a top portion 120, a side portion 130, and/or a flange portion 140. FIG. 1A shows an angled top-down view of the cover 110, and FIG. 1B shows a top-down view of the cover 110.

Figure 2A:
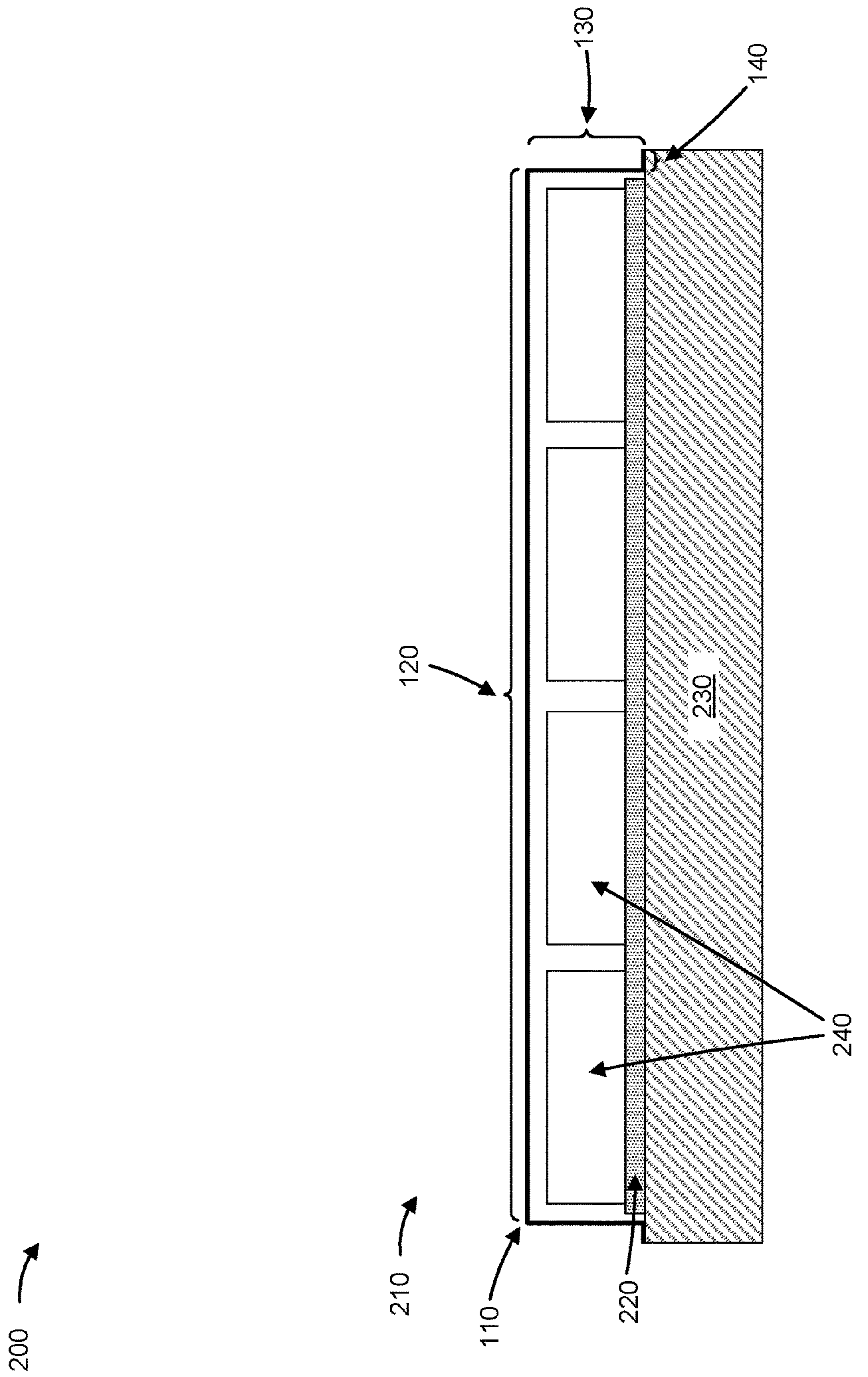
FIGS. 2A-2B are diagrams of an example implementation described herein.
Figure 2B:
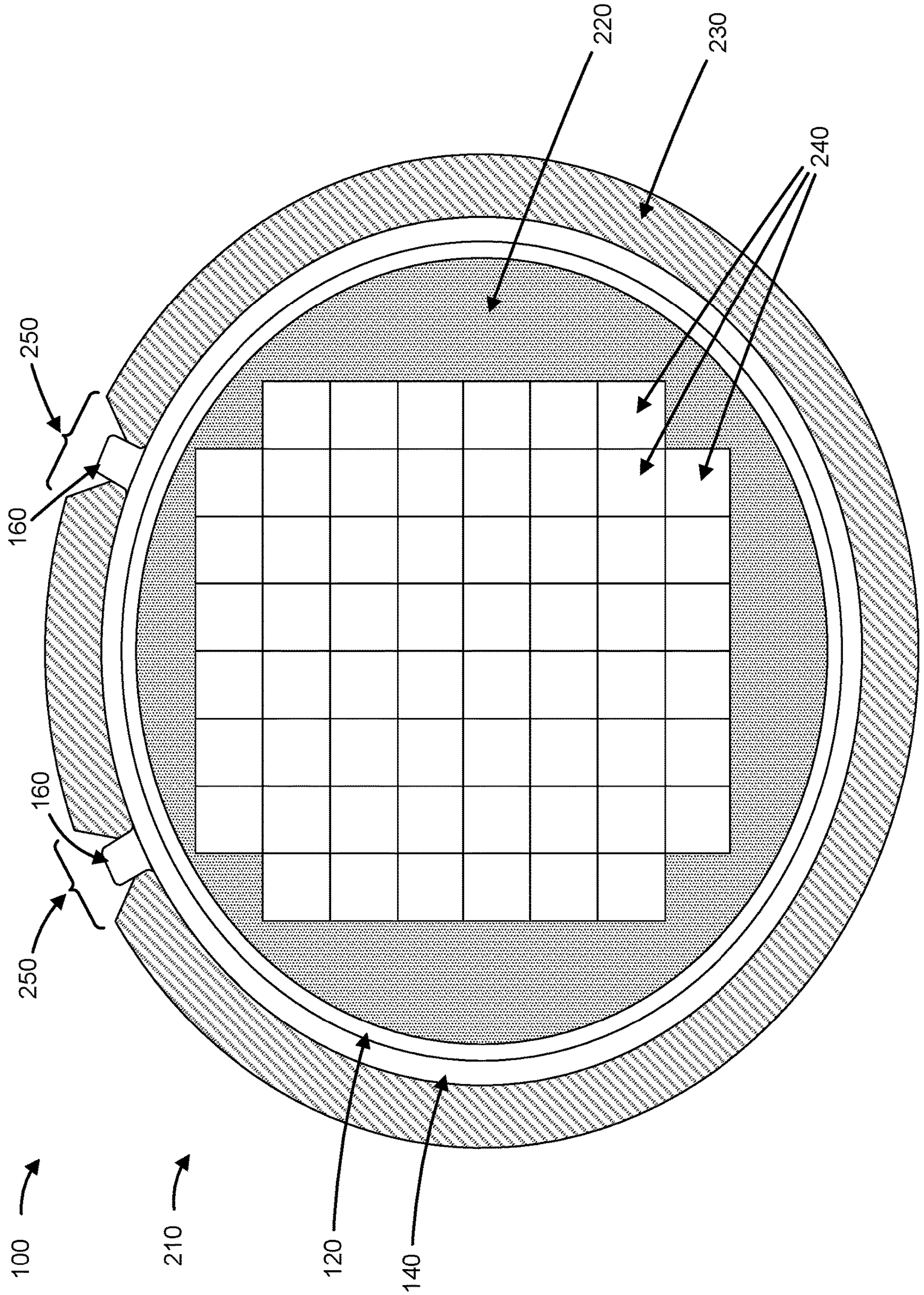

The cover 110 may be configured to be a cover for a wafer (e.g., a wafer 220, described herein in relation to FIGS. 2A-2B), such as when the wafer is on a wafer frame (e.g., a wafer frame 230, described herein in relation to FIGS. 2A-2B). The wafer may have a top surface and a side surface, such as when the wafer has a round shape profile (e.g., the wafer resembles a disk). The cover 110 may cover the wafer when the cover 110 is disposed over the wafer, such as on the wafer frame. In this way, the cover 110 may enclose the wafer (e.g., on the wafer frame).

The top portion 120 may be configured to span the top surface (e.g., an entirety of the top surface) of the wafer (e.g., when the cover 110 is disposed over the wafer). That is, the top portion 120 of the cover 110 may be configured to extend over the top surface of the wafer, such that any region of the top surface of the wafer is to have a corresponding region of the top portion 120 of the cover disposed over (e.g., above) the region of the top surface of the wafer. In some implementations, the top portion 120 may be configured to not contact the top surface of the wafer. That is, the top portion 120 may be configured to be separated from the top surface of the wafer by a gap (e.g., a free-space gap). The top portion 120 may have a shape profile (e.g., to enable the top portion 120 to span the top surface of the wafer). The shape profile may be, for example, circular, oval (e.g., elliptical, such as shown in FIGS. 1A-1B), rectangular, polygonal, or a combination of different shape profiles.

The side portion 130 may be configured to span the side surface (e.g., an entirety of the side surface) of the wafer (e.g., when the cover 110 is disposed over the wafer). That is, the side portion 130 of the cover 110 may be configured to extend over the side surface of the wafer, such that any region of the side surface of the wafer is to have a corresponding region of the side portion 130 of the cover disposed over the region of the side surface of the wafer. In some implementations, the side portion 130 may be configured to not contact the side surface of the wafer. That is, the side portion 130 may be configured to be separated from the side surface of the wafer by a gap (e.g., a free-space gap). The side portion 130 may include a surface (e.g., a bottom surface) that is configured to contact the wafer frame (e.g., when the cover 110 is disposed over the wafer on the wafer frame). This may allow the cover 110 to enclose the wafer, as further described herein.

In some implementations, the side portion 130 may extend (e.g., at a non-zero angle) from the top portion 120. For example, as shown in FIG. 1A, the top portion 120 may extend in a first direction (e.g., that is parallel to x-y plane shown in FIG. 1A), such as to span the top surface of the wafer, and the side portion 130 may extend in a second direction (e.g., that is associated with the z-axis shown in FIG. 1A), such as to span the side surface of the wafer. The first direction may be orthogonal to the second direction (e.g., within a tolerance, which may be less than or equal to one degree, two degrees, three degrees, four degrees, or five degrees). Accordingly, an orientation (e.g., a non-zero angle orientation) of the top portion 120 to the side portion 130 allows the cover 110 to enclose the wafer (e.g., on the wafer frame). That is, the top portion 120 and the side portion 130 may form a continuous surface (or substantially continuous surface), such that the top surface and the side surface of the wafer are enclosed in an internal environment formed by the cover 110 and the wafer frame.

The flange portion 140 may be configured to contact the wafer frame (e.g., when the cover 110 is disposed over the wafer on the wafer frame). That is, the flange portion 140 of the cover 110 may be configured to extend over at least a portion of a surface of the wafer frame (e.g., a top surface of the wafer frame upon which the wafer is disposed). In some implementations, the flange portion 140 may extend (e.g., at a non-zero angle) from the side portion 130. For example, as shown in FIG. 1A, the flange portion 140 may extend in the first direction (e.g., the direction in which the top portion 120 extends, and that is orthogonal to the second direction). Accordingly, an orientation (e.g., a non-zero angle orientation) of the flange portion 140 to the side portion 130 allows the cover 110 to enclose the wafer on the wafer frame. That is, the flange portion 140, the side portion 130, and the top portion 120 may form a continuous surface (or substantially continuous surface), such that the top surface and the side surface of the wafer are enclosed in an internal environment formed by the cover 110 and the wafer frame.

In some implementations, the cover 110 may comprise a material that provides strength, durability, and/or resistance to heat and/or chemicals. For example, the cover 110 may include a material that comprises at least a plastic, such as a material that comprises at least PET, a material that comprises at least polybutylene terephthalate (PBT), a material that comprises at least polycarbonate (PC), a material that comprises at least polyethylene naphthalate (PEN), a material that comprises at least polyethylene furanoate (PEF), a material that comprises at least polyvinylacetate (PCAV), a material that comprises at least polyvinylchloride (PVC), a material that comprises at least polystyrene (PS), or a material that comprises at least polyarylate (PAR).

In some implementations, the top portion 120 may include one or more structural components 150, such as shown in FIG. 1A. The one or more structural components 150 may be configured to prevent the top portion 120 of the cover 110 from bending (or otherwise being physically deformed), such as when a force is applied to the top portion 120. For example, the one or more structural components 150 may be configured to distribute (e.g., evenly distribute) the force across the top portion 120 and/or to increase a stiffness of the top portion 120 (e.g., by reinforcing particular regions of the top portion 120). The one or more structural components 150 may include, for example, one or more indentations, one or more recesses, one or more ribs, and/or one or more other structural components.

In some implementations, the cover 110 may include one or more interaction components 160. The one or more interaction components 160 may be configured to facilitate placement, and removal, of the cover 110 over the wafer (e.g., on the wafer frame), such as by a human technician, a robot, a machine, and/or another device tasked with covering, or uncovering, the wafer. The one or more interaction components 160 may include, for example, one or more tabs, one or more handles, one or more grips, and/or one or more other interaction components. As shown in FIGS. 1A-1B, the one or more interaction components may be included in the flange portion 140.

As indicated above, FIGS. 1A-1B are provided as examples. Other examples may differ from what is described with regard to FIGS. 1A-1B.

FIGS. 2A-2B are diagrams of an example implementation 200 described herein. As shown in FIGS. 2A-2B, example implementation 200 includes a carrier 210, such as for a wafer 220. Accordingly, the carrier 210 may include the wafer 220, a wafer frame 230, and/or the cover 110. The carrier 210 may be configured to protect the wafer 220 after the wafer 220 is processed, and/or when the wafer 220 is transported and/or stored. FIG. 2A shows a side-view of the carrier 210, and FIG. 2B shows a top-down view of the carrier 210 (e.g., when the cover 110 is disposed over the wafer 220 that is disposed on the wafer frame 230).

The wafer 220 may comprise, for example, a material that includes at least glass, a polymer, a metal, silicon, and/or germanium. As shown in FIGS. 2A-2B, the wafer 220 may include a top surface and a side (e.g., as described elsewhere herein). Additionally, the wafer 220 may comprise one or more dies 240, such as on the top surface of the wafer 220. The one or more dies 240 may include, for example, optical components, electrical components, opto-electrical components, and/or other components. As an example, each of the one or more dies 240 may include an optical filter (e.g., an optical interference filter). For example, each die 240 may comprise at least one of a spectral filter, a multispectral filter, a bandpass filter, a blocking filter, a long-wave pass filter, a short-wave pass filter, a dichroic filter, a linear variable filter, a circular variable filter, a Fabry-Perot filter, a Bayer filter, a plasmonic filter, a photonic crystal filter, a nanostructure or metamaterial filter, an absorbent filter, a beam splitter, a polarizing beam splitter, a notch filter, an anti-reflection filter, a reflector, or a mirror, among other examples. The one or more dies 240 may be formed on the wafer 220 (e.g., the top surface of the wafer 220) using a sputtering process, such as a magnetron sputtering process, a singulation process (such as a dicing process), and/or another process.

The wafer frame 230 may comprise, for example, a material that includes a metal and/or a plastic. The wafer frame 230 may include a top surface on which the wafer 220 is disposed. The wafer frame 230 may be configured to hold the wafer 220, such as during formation of the one or more dies 240 on the wafer 220, and/or during transportation and/or storage of the wafer 220. As shown in FIG. 2B, the wafer frame 230 may include one or more orientation components 250, which may be used to ensure proper orientation of the wafer 220 when the one or more dies 240 are formed on the wafer 220 (e.g., the one or more orientation components may interact with other components associated with forming the one or more dies 240 to ensure the proper orientation of the wafer 220). The one or more orientation components may include, for example, one or more indentations, tabs, and/or one or more other orientation components.

The cover 110 may be disposed over the wafer 220, and may therefore cover the wafer 220. For example, as shown in FIG. 1A, the cover 110 may enclose the wafer 220 on the wafer frame 230.

In some implementations, the top portion 120 of the cover 110 may span the top surface (e.g., an entirety of the top surface) of the wafer 220 (e.g., because the cover 110 is disposed over the wafer 220). That is, the top portion 120 of the cover 110 may extend over the top surface of the wafer 220, such that any region of the top surface of the wafer has a corresponding region of the top portion 120 of the cover disposed over (e.g., above) the region of the top surface of the wafer 220. In some implementations, the top portion 120 may not contact the top surface of the wafer 220. That is, the top portion 120 is separated from the top surface of the wafer 220 by a gap (e.g., a free-space gap, such as shown in FIG. 2A). The top portion 120 may have a shape profile, as described elsewhere herein.

The side portion 130 of the cover 110 may span the side surface (e.g., an entirety of the side surface) of the wafer 220 (e.g., because the cover 110 is disposed over the wafer 220). That is, the side portion 130 of the cover 110 may extend over the side surface of the wafer 220, such that any region of the side surface of the wafer 220 has a corresponding region of the side portion 130 of the cover disposed over the region of the side surface of the wafer 220. In some implementations, the side portion 130 may not contact the side surface of the wafer 220. That is, the side portion 130 may be separated from the side surface of the wafer 220 by a gap (e.g., a free-space gap, such as shown in FIG. 2A). The side portion 130 may include a surface (e.g., a bottom surface) that is configured to contact the wafer frame 230 (e.g., because the cover 110 is disposed over the wafer 220 on the wafer frame 230), such as shown in FIG. 2A. This may allow the cover 110 to enclose the wafer 220 (e.g., as shown in FIGS. 2A-2B), as further described herein.

In some implementations, the side portion 130 may extend (e.g., at a non-zero angle) from the top portion 120 (e.g., as described herein in relation to FIGS. 1A-1B). Accordingly, an orientation (e.g., a non-zero angle orientation) of the top portion 120 to the side portion 130 allows the cover 110 to enclose the wafer 220 (e.g., on the wafer frame 230), such as shown in FIGS. 2A-2B. That is, the top portion 120 and the side portion 130 may form a continuous surface (or substantially continuous surface), such that the top surface and the side surface of the wafer 220 are enclosed in an internal environment formed by the cover 110 and the wafer frame 230.

The flange portion 140 may contact the wafer frame 230 (e.g., because the cover 110 is disposed over the wafer 220 on the wafer frame 230). That is, the flange portion 140 of the cover 110 may be configured to extend over at least a portion of a surface of the wafer frame 230 (e.g., a top surface of the wafer frame 230 upon which the wafer 220 is disposed, such as shown in FIG. 2A). In some implementations, the flange portion 140 may extend (e.g., at a non-zero angle) from the side portion 130 (e.g., as described herein in relation to FIGS. 1A-1B). Accordingly, an orientation (e.g., a non-zero angle orientation) of the flange portion 140 to the side portion 130 allows the cover 110 to enclose the wafer 220 on the wafer frame 230, such as shown in FIGS. 2A-2B. That is, the flange portion 140, the side portion 130, and the top portion 120 may form a continuous surface (or substantially continuous surface), such that the top surface and the side surface of the wafer 220 are enclosed in an internal environment formed by the cover 110 and the wafer frame 230.

In some implementations, the cover 110 may include the one or more interaction components 160 that are configured to facilitate placement, and removal, of the cover 110 over the wafer 220 (e.g., on the wafer frame 230). As shown in FIG. 2B, the one or more interaction components 160 may be aligned with the one or more orientation components 250 of the wafer frame 230. That is, an interaction component 160 (e.g., a tab) may be aligned with a corresponding orientation component 250 (e.g., an indent) to facilitate gripping and/or holding of the interaction component 160 to enable placement, and removal, of the cover 110 over the wafer 220 (e.g., on the wafer frame 230).

As indicated above, FIGS. 2A-2B are provided as examples. Other examples may differ from what is described with regard to FIGS. 2A-2B.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A cover for a wafer that is on a wafer frame, comprising:

a top portion configured to span an entirety of a top surface of the wafer comprising one or more dies, the top portion being separated from the one or more dies by a free-space gap;

a side portion configured to span an entirety of a side surface of the wafer, wherein the side portion extends at a non-zero angle from the top portion to allow the cover to enclose the wafer on the wafer frame; and a flange portion extending at a non-zero angle from the side portion and extending over at least a portion of the wafer frame, wherein the flange portion includes one or more interaction components disposed on an outer surface of the flange portion, the one or more interaction components comprising one or more tabs that are aligned with one or more orientation components comprising one or more indentations of the wafer frame to facilitate gripping of the one or more tabs, to enable placement and removal of the cover over the wafer on the wafer frame.

2. The cover of claim 1, wherein the cover includes at least one of:

a material that comprises at least polyethylene terephthalate (PET), a material that comprises at least polybutylene terephthalate (PBT), a material that comprises at least polycarbonate (PC), a material that comprises at least polyethylene naphthalate (PEN), a material that comprises at least polyethylene furanoate (PEF), a material that comprises at least polyvinylacetate (PCAV), a material that comprises at least polyvinylchloride (PVC), a material that comprises at least polystyrene (PS), or a material that comprises at least polyarylate (PAR).

3. The cover of claim 1, wherein:

the top portion extends in a first direction, the side portion extends in a second direction, and the first direction is orthogonal to the second direction within a tolerance, which is less than or equal to five degrees.

4. The cover of claim 1, wherein the top surface of the wafer comprises one or more optical filters, and wherein the top portion is configured to be separated from the one or more optical filters by a free-space gap.

5. The cover of claim 1, wherein the side portion is configured to be separated from the side surface of the wafer by a free-space gap.

6. The cover of claim 1, wherein a surface of the side portion is configured to contact the wafer frame to allow the cover to enclose the wafer on the wafer frame.

7. The cover of claim 1, wherein the top portion includes one or more structural components that are configured to prevent the top portion from bending when a force is applied to the top portion.

8. The cover of claim 1, wherein the top portion has a shape profile that is at least one of:

circular, oval, rectangular, or polygonal.

9. A carrier for a wafer, comprising:

the wafer;

a wafer frame; and a cover, wherein:

the wafer is disposed on the wafer frame, a top portion of the cover spans an entirety of a top surface of the wafer comprising one or more dies, the top portion being separated from the one or more dies by a free-space gap;

a side portion of the cover spans an entirety of a side surface of the wafer, wherein the cover encloses the wafer on the wafer frame; and a flange portion of the cover extends at a non-zero angle from the side portion and extends over at least a portion of the wafer frame, wherein the flange portion includes one or more interaction components disposed on an outer surface of the flange portion, the one or more interaction components comprising one or more tabs that are aligned with one or more orientation components comprising one or more indentations of the wafer frame to facilitate gripping of the one or more stabs, to enable placement and removal of the cover over the wafer on the wafer frame.

10. The carrier of claim 9, wherein the side portion is separated from the side surface of the wafer by a free-space gap.

11. The carrier of claim 9, wherein a surface of the side portion is disposed on the wafer frame.

12. The carrier of claim 9, wherein the top portion includes one or more structural components that are configured to prevent the top portion from bending when a force is applied to the top portion.

13. A carrier for a wafer, comprising:

a cover, wherein:

a top portion of the cover spans an entirety of a top surface of the wafer comprising one or more dies, the top portion being separated from the one or more dies by a free-space gap;

a side portion of the cover spans an entirety of a side surface of the wafer, wherein the side portion extends from the top portion to allow the cover to enclose the wafer on a wafer frame of the carrier; and a flange portion of the cover extends at a non-zero angle from the side portion and extends over at least a portion of the wafer frame, wherein the flange portion includes one or more interaction components disposed on an outer surface of the flange portion, the one or more interaction components comprising one or more tabs that are aligned with one or more orientation components comprising one or more indentations of the wafer frame to facilitate gripping of the one or more tabs, to enable placement and removal of the cover over the wafer on the wafer frame.

14. The carrier of claim 13, wherein the top portion does not contact the top surface of the wafer.

15. The carrier of claim 13, wherein the side portion does not contact the side surface of the wafer.

16. The carrier of claim 13, wherein the top portion includes one or more structural components.

17. The carrier of claim 13, wherein the cover includes at least one of:

a material that comprises at least polyethylene terephthalate (PET), a material that comprises at least polybutylene terephthalate (PBT), a material that comprises at least polycarbonate (PC), a material that comprises at least polyethylene naphthalate (PEN), a material that comprises at least polyethylene furanoate (PEF), a material that comprises at least polyvinylacetate (PCAV), a material that comprises at least polyvinylchloride (PVC), a material that comprises at least polystyrene (PS), or a material that comprises at least polyarylate (PAR).

18. The carrier of claim 13, wherein:

the top portion extends in a first direction, the side portion extends in a second direction, and the first direction is orthogonal to the second direction within a tolerance, which is less than or equal to five degrees.

19. The carrier of claim 13, wherein the top portion has a shape profile that is at least one of:

circular, oval, rectangular, or polygonal.

20. The carrier of claim 13, wherein the top surface of the wafer comprises one or more optical filters, and wherein the top portion is configured to be separated from the one or more optical filters by a free-space gap.

* * * * *